United States Patent
Zhou et al.

(10) Patent No.: US 6,521,539 B1
(45) Date of Patent: Feb. 18, 2003

(54) SELECTIVE ETCH METHOD FOR SELECTIVELY ETCHING A MULTI-LAYER STACK LAYER

(75) Inventors: Mei Sheng Zhou, Singapore (SG); Xue Chun Dai, Singapore (SG); Chiew Wah Yap, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/303,837

(22) Filed: May 3, 1999

(51) Int. Cl.$^7$ ............................................. H01L 21/302
(52) U.S. Cl. ...................... 438/706; 438/720; 438/723; 438/724
(58) Field of Search ................................. 438/706, 723, 438/724, 720

(56) References Cited

U.S. PATENT DOCUMENTS

| | | | | |
|---|---|---|---|---|
| 5,710,073 A | * | 1/1998 | Jeng et al. ................... | 438/239 |
| 5,753,418 A | * | 5/1998 | Tsai et al. .................... | 430/313 |
| 5,773,199 A | * | 6/1998 | Linliu et al. ................. | 430/316 |
| 5,804,088 A | * | 9/1998 | Mckee .......................... | 216/47 |
| 5,924,000 A | * | 7/1999 | Linliu ........................... | 438/592 |
| 6,049,114 A | * | 4/2000 | Maiti et al. .................. | 257/412 |

* cited by examiner

Primary Examiner—Robert Kunemund
Assistant Examiner—Charlotte A. Brown

(74) Attorney, Agent, or Firm—George O. Saile; Rosemary L. S. Pike; Stephen G. Stanton

(57) ABSTRACT

A method for forming a patterned microelectronic layer. There is first provided a substrate. There is then formed over the substrate a multi-layer stack layer comprising: (1) a first lower microelectronic layer; (2) a second intermediate patterned microelectronic layer formed over the first lower microelectronic layer; and (3) a third upper patterned microelectronic layer formed over the second intermediate patterned microelectronic layer, where the first lower microelectronic layer and the third upper patterned microelectronic layer are susceptible to etching within a first etchant. There is then formed encapsulating the first lower microelectronic layer and at least portion of the second intermediate patterned microelectronic layer while leaving exposed at least a portion of the third upper patterned microelectronic layer an encapsulating layer. There is then etched selectively, while employing a first etch method which employs the first etchant, the third upper patterned microelectronic layer while the first lower microelectronic layer and at least the portion of the second intermediate patterned microelectronic layer are encapsulated with the encapsulating layer. Finally, there is then stripped, while employing a second etch method which employs a second etchant, from the first microelectronic layer and at least the portion of the second intermediate patterned microelectronic layer the encapsulating layer. The method may be employed for stripping from a gate electrode within a field effect transistor (FET) a patterned dielectric cap layer formed upon the gate electrode while not etching a gate dielectric layer upon Which is formed the gate electrode within the field effect transistor (FET).

17 Claims, 3 Drawing Sheets

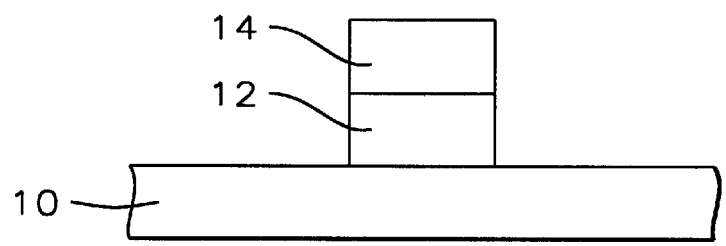
*FIG. 1 - Prior Art*
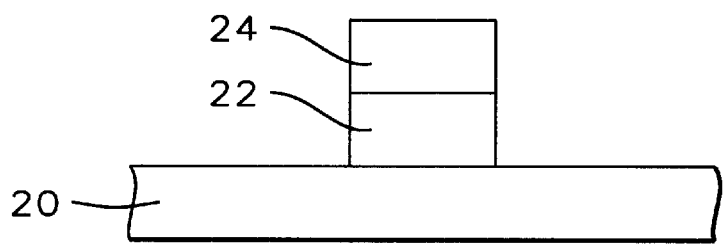
*FIG. 2*
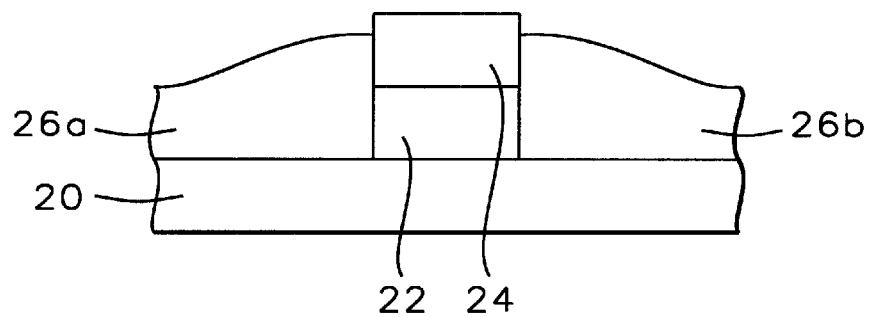
*FIG. 3*
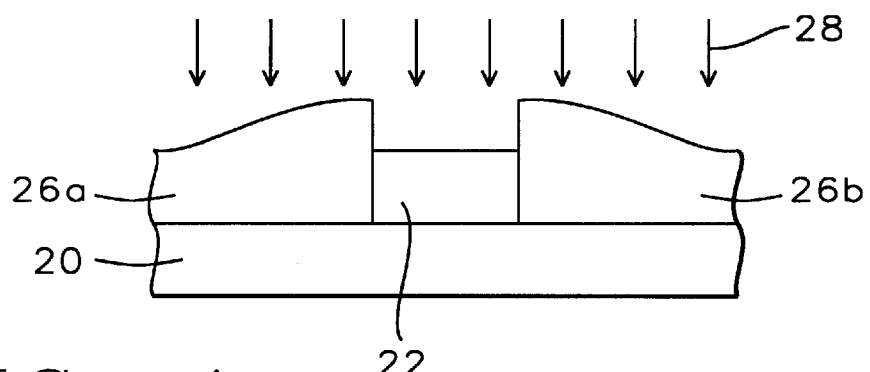
*FIG. 4*

SELECTIVE ETCH METHOD FOR SELECTIVELY ETCHING A MULTI-LAYER STACK LAYER

BACKGROUND OF THE INVENTION

1. Field of the Invention

The present invention relates generally to methods for forming patterned layers within microelectronic fabrications. More particularly, the present invention relates to selective etch methods for forming patterned layers within microelectronic fabrications.

2. Description of the Related Art

Microelectronic fabrications are formed from microelectronic substrates over which are formed patterned microelectronic conductor layers which are separated by microelectronic dielectric layers.

In the course of forming patterned microelectronic layers within microelectronic fabrications, including but not limited to patterned microelectronic conductor layers, patterned microelectronic semiconductor layers and patterned microelectronic dielectric layers within microelectronic fabrications, it is often desirable to selectively etch a first microelectronic layer in the presence of a second microelectronic layer, where the first microelectronic layer and the second microelectronic layer are formed of either equivalent microelectronic materials or sufficiently similar microelectronic materials such that the first microelectronic layer would not otherwise etch selectively with respect to the second microelectronic layer.

An example, by no means limiting, where it is desired to selectively etch within the context of the above limitations a first microelectronic layer in the presence of a second microelectronic layer is illustrated within the schematic cross-sectional diagram of FIG. 1.

Shown in FIG. 1 is a substrate 10 upon which there is formed a second intermediate patterned microelectronic layer 12, which in turn has formed thereupon a third upper patterned microelectronic layer 14. Within FIG. 1, the substrate 10 comprises a first lower microelectronic layer which is formed of a first material either equivalent to a second material from which is formed the third upper patterned microelectronic layer 14 or sufficiently similar such that the substrate 10 and the third upper patterned microelectronic layer 14 are otherwise etchable in the same etchant. Within the context of FIG. 1, a problem towards which the present invention is directed is stripping from the second intermediate patterned microelectronic layer 12 the third upper patterned microelectronic layer 14 while not etching the substrate 10.

It is thus towards the goal of forming within microelectronic fabrications microelectronic structures which result from selectively etching a third upper patterned microelectronic layer in the presence of a first lower microelectronic layer, where the third upper patterned microelectronic layer is separated from the first lower microelectronic layer by a second intermediate patterned microelectronic layer, and where the third upper patterned microelectronic layer is not otherwise selectively etchable within the presence of the first lower microelectronic layer.

Various etch methods have been disclosed in the art of microelectronic fabrication for forming patterned layers with desirable properties within microelectronic fabrications.

For example, Tsai et al., in U.S. Pat. No. 5,753,418, discloses a method for forming within a microelectronic fabrication a patterned layer of aperture width dimension as narrow as about 0.30 microns while employing near ultra-violet (NUV) (i.e. 365 nm) photoexposure radiation. The method employs forming interposed between: (1) a patterned photoresist layer which is patterned employing the near ultra-violet (NUV) photoexposure radiation which provides within the patterned photoresist layer an aperture width dimension typically as narrow as about only 0.35 microns; and (2) a blanket target layer to be patterned while employing the patterned photoresist layer, a blanket focusing layer. The blanket focusing layer is formed of an organic anti-reflective coating (ARC) material which is susceptible to providing a reproducible positive taper of a patterned focusing layer when forming the patterned focusing layer from the blanket focusing layer while employing a plasma etch method which employs an etchant gas composition comprising carbon tetrafluoride and argon. The patterned focusing layer may then be employed as an etch mask for forming a patterned target layer from the blanket target layer.

In addition, Linliu et al., in U.S. Pat. No. 5,773,199, discloses a method for forming within a microelectronic fabrication a patterned microelectronic fabrication structure, such as a gate electrode within a field effect transistor (FET) within a semiconductor integrated circuit microelectronic fabrication, with a linewidth at least as narrow as about 0.25 microns while employing near ultra-violet (NUV) (i.e. 365 nm) photoexposure radiation. Similarly with Tsai et al., as cited above, the method employs forming interposed between: (1) a patterned photoresist layer which is patterned employing the near ultra-violet (NUV) photoexposure radiation; and (2) a blanket target layer which is desired to be patterned while employing the patterned photoresist layer, a blanket focusing layer. However, in contrast with that which is disclosed by Tsai et al., the blanket focusing layer is formed from an organic anti-reflective coating (ARC) material which is susceptible to a reproducible negative etch bias when patterned to form a patterned focusing layer while employing a plasma etch method employing an etchant gas composition comprising trifluoromethane, carbon tetrafluoride, oxygen and argon. The patterned focusing layer may then be employed as an etch mask for forming a patterned target layer from the blanket target layer.

Finally, McKee, in U.S. Pat. No. 5,804,088, also discloses a method for forming within a microelectronic fabrication a patterned layer of linewidth dimension less than about 0.30 microns while employing near ultra-violet (NUV) (i.e. 365 nm) photoexposure radiation. Similarly with the foregoing disclosures, the method employs an intermediate layer formed interposed between: (1) a target layer to be patterned with the linewidth dimension of less than about 0.30 microns; and (2) a patterned photoresist formed employing the near ultra-violet (NUV) photoexposure radiation, where the patterned photoresist layer is further isotropically etched while simultaneously forming a patterned intermediate layer of linewidth less than the patterned photoresist layer, and where the patterned intermediate layer is then employed as an etch mask for forming a patterned target layer from the target layer.

Desirable in the art of microelectronic fabrication are methods for forming within microelectronic fabrications microelectronic structures which result from selectively etching a third upper patterned microelectronic layer in the presence of a first lower microelectronic layer, where the third upper patterned microelectronic layer is separated from the first lower microelectronic layer by a second intermediate patterned microelectronic layer, and where the third upper patterned microelectronic layer is not otherwise selectively etchable within the presence of the first lower microelectronic layer.

It is towards the foregoing object that the present invention is both generally and more specifically directed.

SUMMARY OF THE INVENTION

A first object of the present invention is to provide a method for selectively etching within a microelectronic fabrication a third upper patterned microelectronic layer with respect to a first lower microelectronic layer within a multi-layer microelectronic stack layer within the microelectronic fabrication, where the third upper patterned microelectronic layer is separated from the first lower microelectronic layer by a second intermediate patterned microelectronic layer within the multi-layer microelectronic stack layer.

A second object of the present invention is tor provide a method in accord with the first object of the present invention, where the third upper patterned microelectronic layer within the multi-layer microelectronic stack layer is not otherwise selectively etchable with respect to the first lower microelectronic layer.

A third object of the present invention is to provide a method in accord with the first object of the present invention and the second object of the present invention, which method is readily commercially implemented.

In accord with the objects of the present invention, there is provided by the present invention a method for forming a patterned microelectronic layer. To practice the method of the present invention, there is first provided a substrate. There is then formed over the substrate a multi-layer stack layer comprising: (1) a first lower microelectronic layer; (2) a second intermediate patterned microelectronic layer formed over the first lower microelectronic layer; and (3) a third upper patterned microelectronic layer formed over the second intermediate patterned microelectronic layer, where the first lower microelectronic layer and the third upper patterned microelectronic layer are susceptible to etching within a first etchant. There is then formed encapsulating the first lower microelectronic layer and at least portion of the second intermediate patterned microelectronic layer while leaving exposed at least a portion of the third upper patterned microelectronic layer an encapsulating layer. There is then etched selectively, while employing a first etch method which employs the first etchant, the third upper patterned microelectronic layer while the first lower microelectronic layer and at least the portion of the second intermediate patterned microelectronic layer are encapsulated with the encapsulating layer. Finally, there is then stripped, while employing a second etch method which employs a second etchant, from the first microelectronic layer and at least the portion of the second intermediate patterned microelectronic layer the encapsulating layer.

There is provided by the present invention a method for selectively etching within a microelectronic fabrication a third upper patterned microelectronic layer with respect to a first lower microelectronic layer within a multi-layer microelectronic stack layer within the microelectronic fabrication, where the third upper patterned microelectronic layer is separated from the first lower microelectronic layer by a second intermediate patterned microelectronic layer within the multi-layer microelectronic stack layer, and where the third upper patterned microelectronic layer within the multi-layer microelectronic stack layer is not otherwise selectively etchable with respect to the first lower microelectronic layer. The method of the present invention realizes the foregoing objects by employing when forming the microelectronic fabrication a multi-layer stack layer comprising: (1) a first lower microelectronic layer; (2) a second intermediate patterned microelectronic layer formed over the first lower microelectronic layer; and (3) a third upper patterned microelectronic layer formed over the second intermediate patterned microelectronic layer, where the first lower microelectronic layer and the third upper patterned microelectronic layer are susceptible to etching within a first etchant. There is then formed encapsulating the first lower microelectronic layer and at least part of the second intermediate patterned microelectronic layer an encapsulating layer. There is then etched selectively the third upper patterned microelectronic layer while employing a first etch method employing the first etchant while the first lower microelectronic layer and at least the portion of the second intermediate patterned microelectronic layer are encapsulated with the encapsulating layer. Finally, there is then stripped from the first lower microelectronic layer and at least the portion of the second intermediate patterned microelectronic layer the encapsulating layer while employing a second etch method employing a second etchant.

The method of the present invention is readily commercially implemented. As is illustrated within the Description of the Preferred Embodiments which follows, the present invention employs methods and materials as are otherwise generally known and conventional in the art of microelectronic fabrication. Since it is a particular ordering and use of methods and materials which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein:

FIG. 1 shows a schematic cross-sectional diagram of a microelectronic fabrication conventional in the art of microelectronic fabrication, from which microelectronic fabrication it is desired to strip a third upper patterned microelectronic layer while not etching a first lower microelectronic layer.

FIG. 2, FIG. 3, FIG. 4 and FIG. 5 show a series of schematic cross-sectional diagrams illustrating the results of forming in accord with a general embodiment of the present invention which comprises a first preferred embodiment of the present invention a patterned microelectronic stack layer having stripped from its surface a third upper patterned microelectronic layer while not etching a first lower microelectronic layer, in accord with the present invention.

DESCRIPTION OF THE PREFERRED EMBODIMENTS

Figure 5:
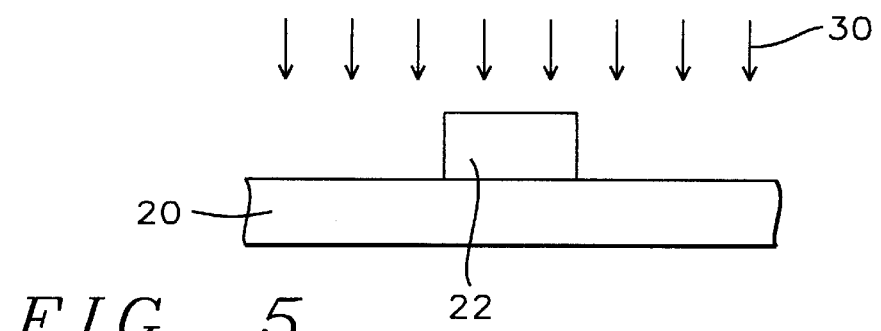

There is provided by the present invention a method for selectively etching within a microelectronic fabrication a third upper patterned microelectronic layer with respect to a first lower microelectronic layer within a multi-layer microelectronic stack layer within the microelectronic fabrication, where the third upper patterned microelectronic layer is separated from the first lower microelectronic layer by a second intermediate patterned microelectronic layer within the multi-layer microelectronic stack layer, and where the third upper patterned microelectronic layer within the multi-layer microelectronic stack layer is not otherwise selectively etchable with respect to the first lower microelectronic layer. The method of the present invention realizes the foregoing objects by employing when forming the microelectronic fabrication a multi-layer stack layer comprising: (1) a first lower microelectronic layer; (2) a second intermediate patterned microelectronic layer formed over the first lower microelectronic layer; and (3) a third upper patterned microelectronic layer formed over the second intermediate patterned microelectronic layer, where the first lower microelectronic layer and the, third upper patterned microelectronic layer are susceptible to etching within a first etchant. There is then formed encapsulating the first lower microelectronic layer and at least part of the second intermediate patterned microelectronic layer an encapsulating layer. There is then etched selectively the third upper patterned microelectronic layer while employing a first etch method employing the first etchant while the first lower microelectronic layer and at least the portion of, the second intermediate patterned microelectronic layer are encapsulated with the encapsulating layer. Finally, there is then stripped from the first lower microelectronic layer and at least the portion of the second intermediate patterned microelectronic layer the encapsulating layer while employing a second etch method employing a second etchant.

The method of the present invention may be employed for forming microelectronic structures resulting from selective etching of third upper patterned microelectronic layers with respect to first lower microelectronic layers within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

First Preferred Embodiment

Referring now to FIG. 2 to FIG. 5, there is shown a series of schematic cross-sectional diagrams illustrating the results of forming, in accord with a general embodiment of the present invention which comprises a first preferred embodiment of the present invention, a patterned microelectronic stack layer having stripped from its surface a third upper patterned microelectronic layer while not etching a first lower microelectronic layer, in accord with the present invention. Shown in FIG. 2 is a schematic cross-sectional diagram of the microelectronic fabrication at an early stage in its fabrication in accord with the first preferred embodiment of the present invention.

Shown in FIG. 2 is a substrate 20 having formed there upon a second intermediate patterned microelectronic layer 22 which in turn has formed and aligned thereupon a third upper patterned microelectronic layer 24.

Within the first preferred embodiment of the present invention with respect to the substrate 20, the substrate 20 may be a substrate employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 2, the substrate 20 may be a substrate alone as employed within the microelectronic fabrication, or, in the alternative, the substrate 20 may be the substrate as employed within the microelectronic fabrication, where the substrate has formed thereupon and/or thereover, and thus incorporated therein, any of several additional layers as are conventional within the microelectronic fabrication within which is employed the substrate. Similarly, with the substrate itself, such additional microelectronic layers may be formed of microelectronic materials selected from the group including but not limited to microelectronic conductor materials, microelectronic semiconductor materials and microelectronic dielectric materials. Within the first preferred embodiment of the present invention, the substrate 20, whether employed as a substrate alone as employed within a microelectronic fabrication or whether employed in the alternative as the substrate as employed within the microelectronic fabrications, where the substrate has additional layers formed thereupon and/or thereover, functions as a first lower microelectronic layer within the microelectronic fabrication whose schematic cross-sectional diagram is illustrated in FIG. 2, analogously within the substrate 10 as illustrated within the schematic cross-sectional diagram of FIG. 1 which also serves as the first lower microelectronic layer within the microelectronic fabrication whose schematic cross-sectional diagram is illustrated in FIG. 1, as discussed in greater detail within the Description of the Related Art.

Similarly, although also not specifically illustrated within the schematic cross-sectional diagram of FIG. 2, the substrate 10, particularly but not exclusively when the substrate 10 comprises a semiconductor substrate employed within a semiconductor integrated circuit microelectronic fabrication, has formed therein and/or thereupon microelectronic devices as are conventional within the microelectronic fabrication within which is employed the substrate 20. Such microelectronic devices may include, but are not limited to, resistors, transistors, diodes and capacitors.

Within the first preferred embodiment of the present invention with respect to the second intermediate patterned microelectronic layer 22, the second intermediate patterned microelectronic layer 22 is, similarly with the substrate 20, also formed from a material selected from the group including but not limited to microelectronic conductor materials, microelectronic semiconductor materials and microelectronic dielectric materials. However, the second intermediate patterned microelectronic layer 22 is formed of a material which is not susceptible to etching within a first etchant which may be employed to etch at least the upper portion of the substrate 20. Typically and preferably, the second intermediate patterned microelectronic layer 22 is formed to a thickness of from about 1000 to about 5000 angstroms upon the substrate 20.

Within the first preferred embodiment of the present invention with respect to the third upper patterned microelectronic layer 24, similarly with the second intermediate patterned microelectronic layer 22 and the substrate 20, the third upper patterned microelectronic layer 24 may independently be formed of a microelectronic material selected from the group including but not limited to microelectronic conductor materials, microelectronic semiconductor materials and microelectronic dielectric materials. However, within the first preferred embodiment of the present invention the third upper patterned microelectronic layer 24 is formed of a material which is susceptible to etching within the first etchant within which at least the upper portion of the substrate 20 is susceptible to etching. Typically and preferably, the third upper patterned microelectronic layer 24 is formed to a thickness of from about 100 to about 1000 angstroms upon the second intermediate patterned microelectronic layer 22.

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein there has been formed adjoining and encapsulating a pair of opposite edges of the second intermediate patterned microelectronic layer 22 and the third upper patterned microelectronic layer 24, while completely covering exposed portions of the substrate 20, a pair of patterned encapsulating microelectronic layers 26a and 26b.

Although within the schematic cross-sectional diagram of FIG. 2 the pair of patterned encapsulating microelectronic layers is illustrated as completely encapsulating the substrate 20, completely encapsulating the second intermediate patterned microelectronic layer 22 and partially encapsulating the third upper patterned microelectronic layer 24, within the method of the present invention and the first preferred embodiment of the method of the present invention, an encapsulating layer (such as is illustrated by the pair of patterned encapsulating microelectronic layers 26a and 26b) need only be formed completely encapsulating a first lower microelectronic layer (such as is illustrated by the substrate 20) and at least portion of a second intermediate patterned microelectronic layer (such as is illustrated by the second intermediate patterned microelectronic layer 22) while leaving exposed at least a portion of a third upper patterned microelectronic layer (such as is illustrated by the third upper patterned microelectronic layer 24).

Within the first preferred embodiment of the present invention, the pair of patterned encapsulating microelectronic layers 26a and 26b may be formed from any of several encapsulating materials as are known in the art of microelectronic fabrication, including inorganic encapsulating materials or organic encapsulating materials, given the proviso that the encapsulating material is not appreciably etchable within the first etchant within which both the third upper patterned microelectronic layer 24 and at least the upper portion of the substrate 20 are susceptible to etching. By "not appreciably" etchable, it is intended that the microelectronic material from which is formed the pair of patterned encapsulating microelectronic layers 26a and 26b have with respect to the material(s) from which is formed the third upper patterned microelectronic layer 24 and at least the upper portion of the substrate 20 an etch rate ratio of at least about 2:1, more preferably at least about 4:1.

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein the third upper patterned microelectronic layer 24 has been etched from the second intermediate patterned microelectronic layer 22 while employing a first etchant 28. Within the first preferred embodiment of the present invention, the first etchant 28 would otherwise etch in addition to the third upper patterned microelectronic layer 24 the substrate 20, but due to the presence of the pair of patterned encapsulating microelectronic layers 26a and 26b, the substrate 20 is not otherwise etched. Although the schematic cross-sectional diagram of FIG. 4 illustrates the third upper patterned microelectronic layer 24 as being completely etched from the second intermediate patterned layer 22 through use of the first etchant 28, there may under certain circumstances exist microelectronic fabrication structures wherein it is desirable to only partially etch a third upper patterned microelectronic layer (such as is illustrated by the third upper patterned microelectronic layer 24) from a second intermediate patterned microelectronic layer (such as is illustrated by the second intermediate patterned microelectronic layer 22) while not etching a first lower microelectronic layer (such as is illustrated by the substrate 20). Such is not precluded within either the present invention or the first preferred embodiment of the present invention.

Referring now to FIG. 5, there is shown a schematic cross-sectional diagram illustrating the results of further processing of the microelectronic fabrication whose schematic cross-sectional diagram is illustrated in FIG. 4.

Shown in FIG. 5 is a schematic cross-sectional diagram of a microelectronic fabrication otherwise equivalent to the microelectronic fabrication whose schematic cross-sectional diagram is illustrated in FIG. 4, but wherein there is stripped from the microelectronic fabrication the pair of patterned encapsulating layers 26a and 26b while employing a second etchant 30.

Within the first preferred embodiment of the present invention, the second etchant 30 may be employed within etch methods including but not limited to wet chemical etch methods and dry plasma etch methods. Within the first preferred embodiment of the present invention, both the substrate 20 and the second intermediate patterned microelectronic layer 22 are substantially un-etched by the second etchant 30. Within the context of the present invention and the first preferred embodiment of the present invention, "substantially un-etched" is intended to indicate that the material from which is formed the patterned encapsulating layers 26a and 26b has with respect to the material from which is formed either the second intermediate patterned microelectronic layer 22 or the substrate 20 an etch rate ratio of greater than about 200:1, preferably greater than about 400:1.

Upon forming the microelectronic fabrication whose schematic cross-sectional diagram is illustrated within FIG. 5, there is formed a microelectronic fabrication having formed therein a microelectronic structure resulting from etching of a third upper patterned microelectronic layer formed upon a second intermediate patterned microelectronic layer in turn formed upon a substrate which comprises a first lower microelectronic layer, where the third upper patterned microelectronic layer is etched while not etching the first lower microelectronic layer, while both the third upper patterned microelectronic layer and the first lower microelectronic layer are nonetheless both susceptible to etching within the same etchant.

Second Preferred Embodiment

Figure 6:
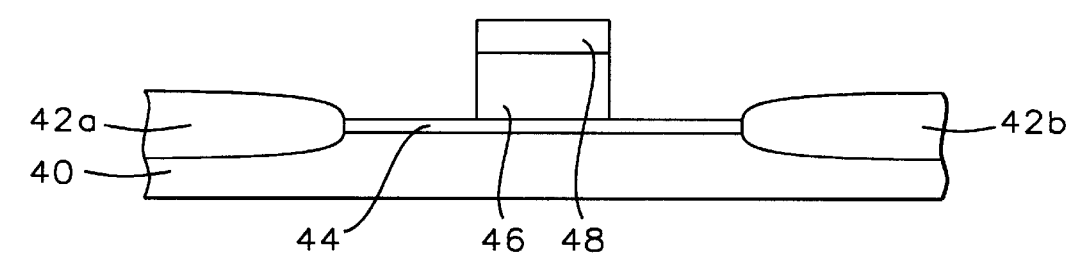
FIG. 6, FIG. 7, FIG. 8, FIG. 9 and FIG. 10 show a series of schematic cross-sectional diagrams illustrating the results of forming in accord with a more specific embodiment of the present invention which comprises a second preferred embodiment of the present invention a gate electrode for use within a field effect transistor (FET) for use within a semiconductor integrated circuit microelectronic fabrication, where the gate electrode has stripped from its surface a patterned dielectric cap layer while not etching a gate dielectric layer employed within the field effect transistor (FET).

Referring now to FIG. 6 to FIG. 10, there is shown a series of schematic cross-sectional diagrams illustrating the results of forming in accord with a more specific embodiment of the present invention which comprises a second preferred embodiment of the present invention a gate electrode within a field effect transistor (FET) within a semiconductor integrated circuit microelectronic fabrication, where the gate electrode has stripped from its surface a patterned dielectric cap layer while not etching a gate dielectric layer employed within the field effect transistor (FET). Shown in FIG. 6 is a schematic cross-sectional diagram of the semiconductor integrated circuit microelectronic fabrication at an early stage in its fabrication in accord with the second preferred embodiment of the present invention.

Shown in FIG. 6, in a first instance, is a semiconductor substrate 40 having formed within and upon its surface a pair of isolation regions 42a and 42b which defines an active region of the semiconductor substrate 40.

Within the second preferred embodiment of the present invention with respect to the semiconductor substrate 40, although it is known in the art of semiconductor integrated circuit microelectronic fabrication that semiconductor substrates are available with either dopant polarity, various dopant concentrations and several crystallographic orientations, for the second preferred embodiment of the present invention the semiconductor substrate 40 is typically and preferably a (100) silicon semiconductor substrate having an N- or P- doping. Similarly, although it is also known in the art of semiconductor integrated circuit microelectronic fabrication that isolation regions may be formed within and/or upon a semiconductor substrate to define an active region of the semiconductor substrate while employing methods including but not limited to isolation regions thermal growth methods and isolation region deposition/patterning methods, for the second preferred embodiment of the present invention, the isolation regions 42a and 42b are typically and preferably formed within and upon the semiconductor substrate 40 to define the active region of the semiconductor substrate 40 while employing an isolation region thermal growth method at a temperature of from about 950 to about 1100 degrees centigrade to form the isolation regions 42a and 42b of silicon oxide within and upon the semiconductor substrate 40.

Shown also within the schematic cross-sectional diagram of FIG. 6 formed upon the active region of the semiconductor substrate 40 is a gate dielectric layer 44, and there is also shown within FIG. 6 formed upon the gate dielectric layer 44 and nominally centered within the active region of the semiconductor substrate 40 a gate electrode 46 having formed and aligned thereupon a patterned dielectric cap layer 48.

Within the second preferred embodiment of the present invention with respect to the gate dielectric layer 44, although it is known in the art of semiconductor integrated circuit microelectronic fabrication that gate dielectric layers may be formed employing methods including but not limited to gate dielectric layer thermal growth methods and gate dielectric layer deposition/patterning methods, for the second preferred embodiment of the present invention, the gate dielectric layer 44 is typically and preferably formed employing a gate dielectric layer thermal growth method at a temperature of from about 700 to about 1000 degrees centigrade to form the gate dielectric layer 44 of silicon oxide of thickness about 20 to about 250 angstroms formed upon the active region of the semiconductor substrate 40.

Within the second preferred embodiment of the present invention with respect to the gate electrode 46, although it is known in the art of semiconductor integrated circuit microelectronic fabrication that gate electrodes may be formed via patterning, while employing methods as are conventional in the art of semiconductor integrated circuit microelectronic fabrication, of blanket layers of gate electrode materials including but not limited to metal, metal alloy, doped polysilicon (typically greater than about 5E19 electrically active dopant atoms per cubic centimeter) and polycide (doped polysilicon/metal silicide stack) gate electrode materials, for the second preferred embodiment of the present invention, the gate electrode 46 is typically and preferably formed via patterning, while employing methods as are conventional in the art of semiconductor integrated circuit microelectronic fabrication, of a blanket layer of doped polysilicon or polycide gate electrode material formed upon the gate dielectric layer 44 and the isolation regions 42a and 42b of the integrated circuit microelectronic fabrication whose schematic cross-sectional diagram is illustrated in FIG. 6 to a thickness of from about 1000 to about 5000 angstroms.

Similarly, within the second preferred embodiment of the present invention with respect to the patterned dielectric cap layer 48, although it is also known in the art of semiconductor integrated circuit microelectronic fabrication that patterned dielectric cap layers may be formed, via patterning, while employing methods as are conventional in the art of semiconductor integrated circuit microelectronic fabrication, of blanket dielectric cap layers formed of dielectric materials including but not limited to silicon oxide dielectric materials, silicon nitride dielectric materials or silicon oxynitride dielectric materials, for the second preferred embodiment of the present invention, the patterned dielectric cap layer 48 is preferably formed via patterning, while employing methods as are conventional in the art of semiconductor integrated circuit microelectronic fabrication, of a blanket dielectric cap layer formed of a silicon containing dielectric material such as a silicon oxide dielectric material, a silicon nitride dielectric material or a silicon oxynitride dielectric material, formed to a thickness of from about 100 to about 500 angstroms upon the blanket gate electrode material layer from which is formed the gate electrode 46.

Although not specifically illustrated within the schematic cross-sectional diagram of FIG. 6, as is understood by a person skilled in the art, the patterned dielectric cap layer 48 and the gate electrode 46 are typically and preferably formed via a sequential patterning of the corresponding blanket dielectric cap layer and the corresponding blanket gate electrode material layer while employing a single patterned photoresist mask layer which is formed upon the blanket dielectric cap layer when forming the patterned dielectric cap layer 48 and the gate electrode 46. Under such circumstances, the blanket dielectric cap layer from which is formed the patterned dielectric cap layer 48 may serve as an anti-reflective coating (ARC) layer when forming the patterned photoresist layer from photoexposure of a corresponding blanket photoresist layer. Alternatively and/or coincidentally, the patterned dielectric cap layer 48 may also serve as a hard mask layer which provides superior linewidth control when forming the gate electrode 46 from the blanket gate electrode material layer.

Within the second preferred embodiment of the present invention, it is desired to strip from gate electrode 46 the patterned dielectric cap layer 48 while not etching the gate dielectric layer 44, where since both the patterned dielectric cap layer 48 and the gate dielectric layer 44 are formed of analogous or equivalent silicon containing dielectric materials the patterned dielectric cap layer 48 is not otherwise typically selectively etchable within the presence of the gate dielectric layer 44.

Figure 7:
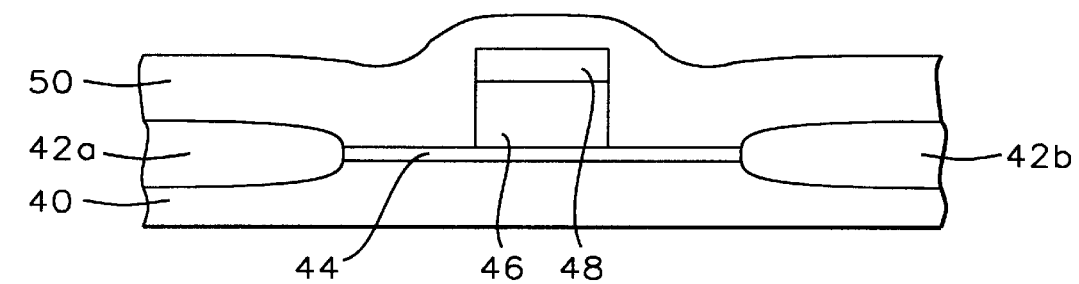

Referring now to FIG. 7, there is shown a schematic cross-sectional diagram illustrating the results of further processing of the microelectronic fabrication whose schematic cross-sectional diagram is illustrated in FIG. 6.

Shown in FIG. 7 is a schematic cross-sectional diagram of a microelectronic fabrication otherwise equivalent to the microelectronic fabrication whose schematic cross-sectional diagram is illustrated in FIG. 6, but wherein there has been formed upon the microelectronic fabrication and totally encapsulating the patterned dielectric cap layer 48, the gate electrode 46, the gate dielectric layer 44 and the pair of isolation regions 42a and 42b a blanket encapsulating layer 50.

Within the second preferred embodiment of the present invention with respect to the blanket encapsulating layer 50, although the blanket encapsulating layer 50 may be formed of encapsulating materials selected from the general groups of encapsulating materials including but not limited to organic encapsulating materials and inorganic encapsulating materials which may be formed with a profile as illustrated within the schematic cross-sectional diagram of FIG. 7, where the blanket encapsulating layer 50 has a limited thickness over the patterned dielectric cap layer 48 in comparison with other portions of the blanket encapsulating layer 50, the blanket encapsulating layer 50 is typically and preferably formed of an organic polymer spin-on-polymer (SOP) encapsulating material. Typically and preferably, the organic polymer spin-on-polymer (SOP) encapsulating material is formed in a substantially planarizing manner which leaves remaining a thickness of the blanket planarizing layer 50 of about 200 angstroms over the patterned dielectric cap layer 48. The organic polymer spin-on-polymer (SOP) encapsulating material from which is formed the blanket encapsulating layer 50 may comprise an antireflective coating (ARC) organic polymer spin-on-polymer (SOP) encapsulating material, a photoresist organic polymer spin-on-polymer (SOP) encapsulating material, or an otherwise functional or non-functional organic polymer spin-on-polymer (SOP) encapsulating material.

Figure 8:
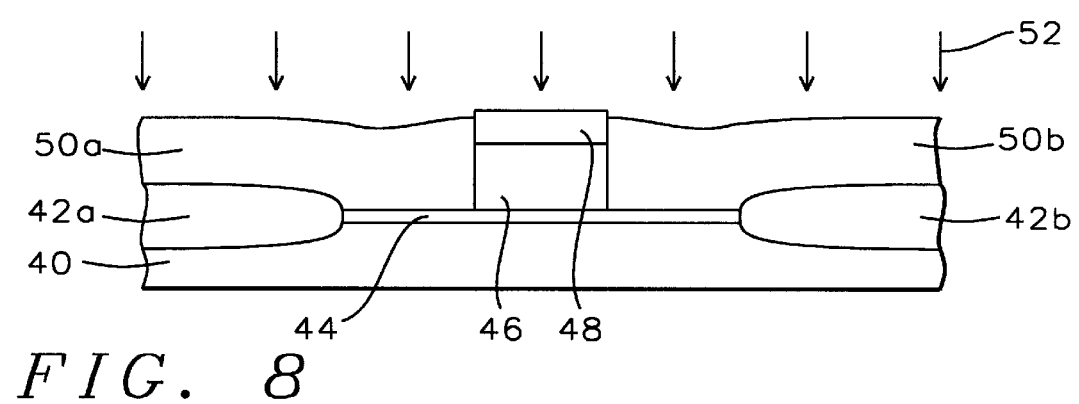

Referring now to FIG. 8, there is shown a schematic cross-sectional diagram illustrating the results of further processing of the semiconductor integrated circuit microelectronic fabrication whose schematic cross-sectional diagram is illustrated in FIG. 7.

Shown in FIG. 8 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 7, but wherein the blanket encapsulating layer 50 has been etched within a first etchant 52 to form a pair of patterned encapsulating layers 50a and 50b while leaving exposed at least a portion of the patterned dielectric cap layer 48, and while simultaneously at least partially encapsulating the gate electrode 46 and fully encapsulating the gate dielectric layer 44. Within the second preferred embodiment of the present invention, the patterned encapsulating layers 50a and 50b serve analogously with the patterned encapsulating layers 26a and 26b within the first preferred embodiment of the present invention as illustrated within the schematic cross-sectional diagram of FIG. 3.

Within the second preferred embodiment of the present invention with respect to the first etchant 52, when the blanket encapsulating layer 50 is formed of an organic polymer spin-on-polymer (SOP) encapsulating material, the first etchant 52 is typically and preferably a first plasma etchant employed within a first plasma etch method, where the first plasma etchant comprises an etchant gas composition which upon plasma activation provides an oxidizing species. Although any of several oxidizing etchant gas compositions may be employed as the first plasma etchant within the first plasma etch method, including but not limited to oxygen, ozone, nitrous oxide and nitric oxide containing oxidizing etchant gas compositions, along with suitable diluents and co-reactants, more preferably, the first plasma etchant within the first plasma etch method comprises is a first plasma etchant comprising oxygen and hydrogen bromide. Within the first plasma etchant, hydrogen bromide is employed for providing optimal control of the etch rate of the blanket encapsulating layer 50.

When etching the blanket encapsulating layer 50 to form the pair of patterned encapsulating layers 50a and 50b upon an eight inch diameter semiconductor substrate 40, the first plasma etch method also employs: (1) a reactor chamber pressure of from about 0.02 to about 0.1 torr; (2) a radio frequency source power of from about 100 to about 400 watts at a source radio frequency of 13.56 MHZ and a bias power of from about 50 to about 100 watts; (3) a semiconductor substrate 40 temperature of from about 30 to about 60 degrees centigrade; (4) an oxygen flow rate of from about 20 to about 50 standard cubic centimeters per minute (sccm); and (5) a hydrogen bromide flow rate of from about 10 to about 20 standard cubic centimeters per minute (sccm), which typically provides an etch rate of the blanket encapsulating layer 50 of from about 100 to about 1000 angstroms per minute.

Typically and preferably, when employing the first plasma etch method employing the first etchant 52 to etch the blanket encapsulating layer 50 when forming the patterned encapsulating layers 50a and 50b, the blanket encapsulating layer 50 is etched to fully expose the surface of the patterned dielectric cap layer 48 while fully encapsulating the gate electrode 46 and the gate dielectric layer 44, although further etching of the patterned encapsulating layers 50a and 50b within the context of the limits disclosed within the first preferred embodiment of the present invention is not precluded within the second preferred embodiment of the present invention.

As is understood by a person skilled in the art, although the schematic cross-sectional diagram of FIG. 8 illustrates a blanket etchback of the blanket encapsulating layer 50 to form the patterned encapsulating layers 50a and 50b while employing the first etchant 52, it is also plausible and under certain circumstances preferred within the present invention, including either the first preferred embodiment of the present invention or the second preferred embodiment of the present invention, that there is instead employed a selective photoexposure and development of a blanket encapsulating layer 50 when formed of a photoresist organic polymer spin-on-polymer (SOP) material to provide a further selective exposure of only a subgroup of third upper patterned microelectronic layers, such as the patterned dielectric cap layer 48, within a microelectronic fabrication analogous or equivalent to the microelectronic fabrication whose schematic cross-sectional diagram is illustrated within FIG. 8. Such additional selectivity may provide for greater process latitude when fabricating certain types of microelectronic fabrications while employing the method of the present invention. For example and without limitation, such additional selectivity may provide an opportunity for selectively forming multiple types of metal silicide layers within subgroups of gate electrodes or polysilicon interconnects within a microelectronic fabrication analogous or equivalent to the microelectronic fabrication whose schematic cross-sectional diagram is illustrated in FIG. 8. For additional example and without limitation, such polysilicon interconnects may be formed upon isolation regions within the microelectronic fabrication, such as the isolation regions 42a and 42b as is illustrated within the microelectronic fabrication whose schematic cross-sectional diagram is illustrated in FIG. 8, and the subgroups of polysilicon interconnects and/or gate electrodes need not be of equivalent height above the substrate employed within the microelectronic fabrication.

Figure 9:
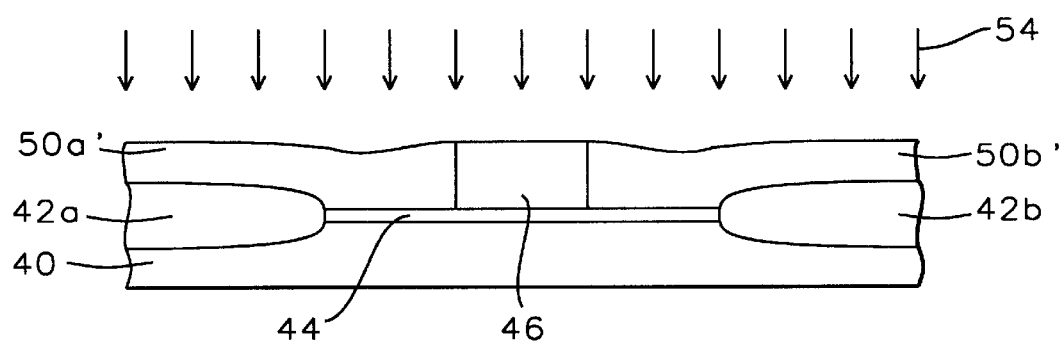

Referring now to FIG. 9, there is shown a schematic cross-sectional diagram illustrating the results of further processing of the semiconductor integrated circuit microelectronic fabrication whose schematic cross-sectional diagram is illustrated in FIG. 8.

Shown in FIG. 9 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 8, but wherein there has been etched from the gate electrode 46 the patterned dielectric cap layer 48 while employing a second etchant 54, while simultaneously further etching the pair of patterned encapsulating layers 50a and 50b to form a pair of etched patterned encapsulating layers 50a' and 50b'.

Within the second preferred embodiment of the present invention with respect to the second etchant 54, under circumstances where the patterned dielectric cap layer 48 is formed from a silicon containing dielectric material such as but not limited to a silicon oxide dielectric material, a silicon nitride dielectric material or a silicon oxynitride dielectric material, the second etchant 54 is typically and preferably a second plasma etchant employed within a second plasma etch method, where the second plasma etchant comprises a second etchant gas composition which upon plasma activation provides an active fluorine containing etchant species. More typically and preferably, the second etchant gas composition comprises a fluorocarbon, such as but not limited to a perfluorocarbon or a hydrofluorocarbon of up to about 5 carbon atoms, sulfur hexafluoride or nitrogen trifluoride, along with suitable diluents. Most typically and preferably, the second etchant gas composition comprises carbon tetrafluoride.

Similarly, typically and preferably, when etching the patterned dielectric cap layer 48 from upon the gate electrode 46 upon an eight inch diameter semiconductor substrate 40, the second plasma etch method also employs: (1) a reactor chamber pressure of from about 0.01 to about 0.1 torr; (2) a radio frequency source power of from about 100 to about 400 watts at a source radio frequency of 13.56 MHZ and a bias power of from about 100 to about 300 watts; (3) a semiconductor substrate 40 temperature of from about 30 to about 60 degrees centigrade; and (4) a carbon tetrafluoride flow rate of from about 20 to about 100 standard cubic centimeters per minute (sccm), to provide an etch rate ratio of the material from which is formed the patterned dielectric cap layer 48 with respect to the material from which is formed the blanket encapsulating layer 50 of at least about 5:1.

Figure 10:
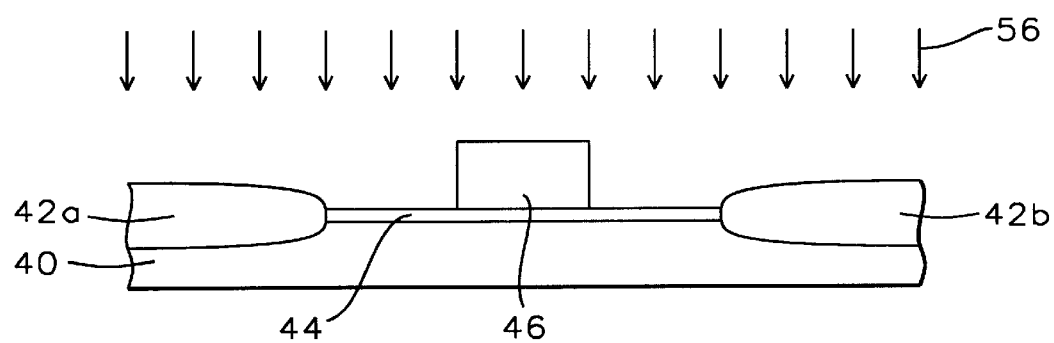

Referring now to FIG. 10, there is shown a schematic cross-sectional diagram illustrating the results of further processing of the semiconductor integrated circuit microelectronic fabrication whose schematic cross-sectional diagram is illustrated in FIG. 9.

Shown in FIG. 10 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 9, but wherein there has been stripped from the semiconductor integrated circuit microelectronic fabrication the pair of etched patterned encapsulating layers 50a' and 50b' through etching within a third etchant 56.

Within the second preferred embodiment of the present invention with respect to the third etchant 56, the third etchant 56 will typically and preferably employ etchants as are typical in the art of microelectronic fabrication for stripping organic polymer spin-on-polymer (SOP) encapsulating materials from upon microelectronic fabrications. Such etchants may include plasma etchant gas compositions which upon plasma activation provide active oxidizing species (such as are employed within the first plasma etch method which employs the first etchant 52 as illustrated within the schematic cross-sectional diagram of FIG. 8), as well as organic solvent etchants as are conventional in the art of microelectronic fabrication, although plasma etch methods which employ etchant gas compositions which upon plasma activation form active oxidizing species are typically preferred.

When stripping the etched patterned encapsulating layers 50a' and 50b' from over an eight inch diameter semiconductor substrate 40 while employing a third plasma etch method which employs an oxygen plasma as the third etchant 56, there is typically and preferably also employed: (1) a reactor chamber pressure of from about 0.5 to about 2 torr; (2) a radio frequency source power of from about 500 to about 800 watts at a source radio frequency of 13.56 MHZ and a bias power of up to about 100 watts; (3) a semiconductor substrate 40 temperature of from about 100 to about 250 degrees centigrade; (4) an oxygen flow rate of from about 100 to about 500 standard cubic centimeters per minute (sccm).

Upon forming the semiconductor integrated circuit microelectronic fabrication whose schematic cross-sectional diagram is illustrated in FIG. 10, there is formed a semiconductor integrated circuit microelectronic fabrication having formed therein a gate electrode for use within a field effect transistor (FET), from which gate electrode has been stripped a patterned dielectric cap layer while not etching a gate dielectric layer which is employed within the field effect transistor (FET) within the semiconductor integrated circuit microelectronic fabrication. The foregoing result is realized by completely encapsulating the gate dielectric layer and at least a portion of the gate electrode within the semiconductor integrated circuit microelectronic fabrication while employing an encapsulating layer which leaves exposed at least a portion of the patterned dielectric cap layer, while stripping the patterned dielectric cap layer while employing an etchant which would otherwise etch both the patterned dielectric cap layer and the gate dielectric layer.

The semiconductor integrated circuit microelectronic fabrication whose schematic cross-sectional diagram is illustrated in FIG. 10 may be further fabricated employing methods and materials as are conventional in the art of semiconductor integrated circuit microelectronic fabrication to provide a fully functional field effect transistor (FET) within the semiconductor integrated circuit microelectronic fabrication. Such methods and materials will typically include ion implant methods as are conventional in the art of semiconductor integrated circuit microelectronic fabrication to form within the field effect transistor (FET) a pair of source/drain regions within the active region of the semiconductor substrate 40 at areas not covered by the gate electrode 46.

As is understood by a person skilled in the art, the preferred embodiments of the present invention are illustrative of the present invention rather than limiting of the present invention. Revisions and modifications may be made to methods, materials, structures and dimensions through which is provided a microelectronic fabrication or a semiconductor integrated circuit microelectronic fabrication in accord with the preferred embodiments of the present invention while still providing embodiments of the present invention which are within the spirit and scope of the present invention, as defined by the appended claims.

What is claimed is:

1. A method for forming a patterned microelectronic layer comprising:

providing a substrate; the substrate being a first lower microelectronic layer;

forming over the first lower microelectronic layer a multi-layer stack layer comprising:
a second intermediate patterned microelectronic layer formed over the first lower microelectronic layer; and
a third upper patterned microelectronic layer formed over the second intermediate patterned microelectronic layer, where the first lower microelectronic layer and the third upper patterned microelectronic layer are susceptible to etching within a first etchant;

forming an encapsulating layer upon the first lower microelectronic layer, encapsulating the first lower microelectronic layer and at least a portion of the second intermediate patterned microelectronic layer, while leaving exposed at least a portion of the third upper microelectronic layer;

etching selectively, while employing a first etch method which employs the first etchant, the third upper patterned microelectronic layer while the first lower microelectronic layer and at least the portion of the second intermediate patterned microelectronic layer are encapsulated within the encapsulating layer; and stripping, while employing a second etch method which employs a second etchant, the encapsulating layer from the first microelectronic layer and at least the portion of the second intermediate patterned microelectronic layer encapsulated by the encapsulating layer.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein each of the first lower microelectronic layer, the second intermediate patterned microelectronic layer and the third upper patterned microelectronic layer is independently formed from a microelectronic material selected from the group consisting of microelectronic conductor materials, microelectronic semiconductor materials and microelectronic dielectric materials.

4. The method of claim 1 wherein the second intermediate patterned microelectronic layer is formed to a thickness of from about 1000 to about 5000 angstroms.

5. The method of claim 1 wherein the third upper patterned microelectronic layer is formed to a thickness of from about 100 to about 1000 angstroms.

6. The method of claim 1 wherein the encapsulating layer is formed from an encapsulating material selected from the group consisting of inorganic encapsulating materials and organic encapsulating materials.

7. The method of claim 1 wherein the encapsulating layer is formed to leave exposed at least the portion of the third upper patterned microelectronic layer while not exposing a portion of an other third upper patterned microelectronic layer within an other multi-layer stack layer also formed over the substrate.

8. The method of claim 7 wherein:

the second intermediate patterned microelectronic layer within the multi-layer stack and an other second intermediate patterned microelectronic layer within the other multi-layer stack are both formed of polysilicon; and a metal silicide layer is formed selectively upon the second intermediate patterned microelectronic layer.

9. The method of claim 8 wherein the second intermediate patterned microelectronic layer and the other second intermediate patterned microelectronic layer are each independently selected from the group of microelectronic layers consisting of gate electrodes and polysilicon interconnects.

10. The method of claim 1 wherein the first etch method is a first plasma etch method.

11. A method for forming a gate electrode comprising:

providing a semiconductor substrate;

forming over the semiconductor substrate a multi-layer stack layer comprising:
a gate dielectric layer formed upon the semiconductor substrate;
a gate electrode formed upon the gate dielectric layer; and
a patterned dielectric cap layer formed and aligned upon the gate electrode, where the gate dielectric layer and the patterned dielectric cap layer are susceptible to etching within a first etchant;

forming an encapsulating layer upon the gate dielectric layer, encapsulating the gate dielectric layer and at least a portion of the gate electrode, while leaving exposed at least a portion of the patterned dielectric cap layer;

etching selectively, while employing a first etch method which employs the first etchant, the patterned dielectric cap layer while the gate dielectric layer and at least the portion of the gate electrode are encapsulated within the encapsulating layer; and stripping, while employing a second etch method which employs a second etchant, the encapsulating layer from the gate dielectric layer and at least the portion of the gate electrode encapsulated by the encapsulating layer.

12. The method of claim 11 wherein the gate electrode is formed to a thickness of from about 1000 to about 5000 angstroms.

13. The method of claim 11 wherein the patterned dielectric cap layer is formed to a thickness of from about 100 to about 500 angstroms.

14. The method of claim 11 wherein the encapsulating layer is formed from an organic polymer spin-on-polymer (SOP) encapsulating material.

15. The method of claim 11 wherein the encapsulating layer is formed to leave exposed at least the portion of the patterned dielectric cap layer while not exposing a portion of another patterned dielectric cap layer formed within another multi-layer stack layer also formed over the semiconductor substrate.

16. The method of claim 15 wherein:
the gate electrode is formed of polysilicon; and
there is selectively formed upon the gate electrode a metal silicide layer while not further processing the other multi-layer stack layer also formed over the substrate.

17. The method of claim 11 wherein the first etch method is a first plasma etch method.

* * * * *